United States Patent
Lin

(10) Patent No.: US 10,648,597 B2
(45) Date of Patent: May 12, 2020

(54) PIPE CONNECTOR STRUCTURE

(71) Applicant: THERMALTAKE TECHNOLOGY CO., LTD., Taipei (TW)

(72) Inventor: Pei-Hsi Lin, Taipei (TW)

(73) Assignee: THERMALTAKE TECHNOLOGY CO., LTD. (TW)

( * ) Notice: Subject to any disclaimer, the term of this patent is extended or adjusted under 35 U.S.C. 154(b) by 161 days.

(21) Appl. No.: 15/627,471

(22) Filed: Jun. 20, 2017

(65) Prior Publication Data
US 2018/0231159 A1    Aug. 16, 2018

(30) Foreign Application Priority Data

Feb. 15, 2017   (TW) .............................. 106202166 U

(51) Int. Cl.
*F16L 19/06* (2006.01)
*H05K 7/20* (2006.01)
*F16L 19/02* (2006.01)

(52) U.S. Cl.
CPC .......... *F16L 19/06* (2013.01); *F16L 19/0206* (2013.01); *H05K 7/20272* (2013.01)

(58) Field of Classification Search
CPC ......... F16L 19/06; F16L 15/007; F16L 33/32; F16L 19/00; F16L 19/005; F16L 19/065; F16L 5/08; F16L 15/00; F16L 19/0206; H05K 7/20272
USPC ......... 285/39, 331, 336, 351, 354, 391, 392, 285/393, 333, 328, 330, 339, 356, 355, 285/386, 389
See application file for complete search history.

(56) References Cited

U.S. PATENT DOCUMENTS

| | | | | |
|---|---|---|---|---|
| 2,419,453 A | * | 4/1947 | Kocevar | F16L 15/08 285/148.23 |
| 3,365,219 A | * | 1/1968 | Nicolaus | F16L 19/086 285/340 |
| 3,879,070 A | * | 4/1975 | Russ | F16L 19/12 285/342 |
| 4,674,775 A | * | 6/1987 | Tajima | F16L 19/0206 285/354 |
| 4,801,158 A | * | 1/1989 | Gomi | F16L 25/0036 285/330 |
| 5,452,923 A | * | 9/1995 | Smith | E21B 17/04 166/378 |

(Continued)

*Primary Examiner* — Zachary T Dragicevich
*Assistant Examiner* — William S. Choi
(74) *Attorney, Agent, or Firm* — Schmeiser, Olsen & Watts, LLP

(57) ABSTRACT

A pipe connector structure includes a base, having a through hole and a revealed upper surface, comprising a first thread portion for connecting to an intercommunicating device and a second thread portion located on the first thread portion; a lid, having a central through hole; a sleeve, accommodated in the lid; and a first O-ring, disposed at the revealed upper surface and encircling the through hole. The lid includes an inner thread structure corresponding to a thread of an outer sidewall of the second thread portion. Accordingly, a user is capable of accurately cutting a water cooling pipe having an appropriate length according to the revealed upper surface of the pipe connector structure, thereby effectively solving issues of being uncertain whether the water cooling pipe is completely inserted into the base and being likely inserted in an unaligned manner as well as reducing risks of liquid leakage.

8 Claims, 4 Drawing Sheets

(56) References Cited

U.S. PATENT DOCUMENTS

| | | | | |
|---|---|---|---|---|
| 6,746,055 | B1* | 6/2004 | Wood | F16L 19/062 285/222.1 |
| 7,303,418 | B2* | 12/2007 | O'Connor | H01R 13/5208 439/277 |
| 7,914,048 | B2* | 3/2011 | Shemtov | F16L 5/06 174/653 |
| 8,586,881 | B1* | 11/2013 | Shemtov | F16L 19/061 174/652 |
| 9,562,637 | B1* | 2/2017 | Crompton | F16L 21/007 |
| 2004/0169367 | A1* | 9/2004 | Sutherland | E21B 17/003 285/53 |
| 2004/0255608 | A1* | 12/2004 | Hector | F16L 19/065 62/474 |
| 2007/0052234 | A1* | 3/2007 | Breay | F16L 19/005 285/354 |
| 2008/0217917 | A1* | 9/2008 | Chiu | F16L 25/0036 285/354 |
| 2009/0230678 | A1* | 9/2009 | Krohn | F16L 19/061 285/354 |
| 2010/0019484 | A1* | 1/2010 | Krohn | F16L 19/065 285/104 |
| 2011/0012346 | A1* | 1/2011 | Tausch | B60P 1/56 285/330 |
| 2011/0304137 | A1* | 12/2011 | Ericksen | F16L 37/091 285/331 |
| 2013/0147189 | A1* | 6/2013 | Horsfall | F16L 19/046 285/353 |
| 2013/0181445 | A1* | 7/2013 | Glime | F16L 15/04 285/337 |
| 2015/0152986 | A1* | 6/2015 | Taylor | F16L 19/061 285/332.2 |

\* cited by examiner

PIPE CONNECTOR STRUCTURE

CROSS-REFERENCE TO RELATED APPLICATION

This non-provisional application claims priority under 35 U.S.C. § 119(a) on Patent Application No(s). 106202166 filed in Taiwan, R.O.C. on Feb. 15, 2017, the entire contents of which are hereby incorporated by reference.

BACKGROUND OF THE INVENTION

Field of the Invention

The present invention relates to a pipe connector structure, and more particularly to a pipe connector structure including a base with a revealed upper surface.

Description of the Prior Art

With highly developed information technologies, chips used in electronic devices such as hard drives, motherboards and central processors and components are getting more and more complicated, with amounts of associated computed and processed data as well as corresponding processing speeds also becoming ever-increasing. Consequently, operation temperatures of the integrated circuits (chips) of these electronic devices and components easily become too high. If heat energy is not appropriately dissipated in time, normal operations of these electronic devices and components are inevitably affected, causing reduced operation speeds or even shortened lifecycles.

There are numerous ways to assist in heat dissipation of chips, e.g., producing forced convection using fans, increasing heat dissipation areas through cooling fins, increasing heat dissipation areas and producing forced convection through cooling fins and fans, or drawing away heat using liquid transported by water cooling pipes. Among the above, head dissipation efficiency of drawing away heat using liquid transported by water cooling pipes is better. In general, a pipe connector is needed to connect a water cooling pipe. FIG. 1 shows a schematic diagram of a pipe connector 100' for connecting a water cooling pipe 90' of the prior art.

As shown in FIG. 1, the pipe connector 100' of the prior art includes a base 10', a rotating lid 20' and an O-ring 40'. To connect the water cooling pipe 90' to an intercommunicating device (e.g., a water cooling fin), the base 10' is first rotated and mounted on the intercommunicating device, the rotating lid 20' is sleeved around the water cooling pipe 90', the water cooling pipe 90' is inserted through the O-ring 40' and inserted into the base 10', and the rotating lid 20' is fastened on the based 10', thus completing the connection of the water cooling pipe 90' and the intercommunicating device through the pipe connector 100'.

However, because an inner upper surface of the base 10' of the pipe connector 100' is shielded by its thread portion 15', a user cannot accurately cut the water cooling pipe 90' with an appropriate length according to a space that the base 10' occupies. Further, not only the water cooling pipe 90' is likely inserted in an unaligned manner when inserted into the base 10', but also it is difficult to ascertain whether the water cooling pipe 90' is completely inserted into the base 10'. Further, the above assembly operations cannot be easily performed in a small space. These issues may cause risks of leakage of the liquid flowing in the water cooling pipe 90'.

SUMMARY OF THE INVENTION

It is an object of the present invention to provide a pipe connector structure including a base having a revealed upper surface to effectively solve issues of a pipe connector of the prior art.

To achieve the above and other objects, the present invention provides a pipe connector structure including: a base, having a through hole and a revealed upper surface, comprising a first thread portion for connecting to an intercommunicating device and a second thread portion located on the first thread portion; a lid, having a central through hole; a sleeve, accommodated in the lid; and a first O-ring, disposed at the revealed upper surface and encircling the through hole. Wherein, the lid includes an inner thread structure, which corresponds to a thread at an outer sidewall of the second thread portion.

In one embodiment of the present invention, the sleeve and the lid are a formed integral.

In one embodiment of the present invention, the pipe connector structure further includes a second O-ring disposed between the sleeve and the lid.

In one embodiment of the present invention, the pipe connector structure further includes at least one inner O-ring disposed at an inner sidewall of the sleeve.

In one embodiment of the present invention, the pipe connector structure further includes an outer O-ring disposed at an outer sidewall where the first thread portion and the second thread portion are connected, and the outer O-ring reveals a thread of the first thread portion.

In one embodiment of the present invention, the pipe connector structure further includes two notches symmetrically located at a periphery of the through hole and recessed from the revealed upper surface towards an inner part of the base.

In one embodiment of the present invention, the lid has a coarse outer sidewall.

In one embodiment of the present invention, wherein a diameter of the second thread portion is greater than a diameter of the first thread portion.

Accordingly, in the pipe connector structure provided by the present invention, the base has a revealed upper surface. According to the revealed upper surface, a user may accurately cut a water cooling pipe having an appropriate length, and is not required to connect the water cooling pipe to the pipe connector structure of the present invention through an inserting method, thereby effectively solving issues of being uncertain whether the water cooling pipe is completely inserted into the base and being likely inserted in an unaligned manner as well as reducing risks of liquid leakage. Further, the pipe connector structure of the present invention is applicable to a small space; that is, the pipe connector structure of the present invention is apt for a greater application range.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE EMBODIMENTS

To thoroughly understand the present invention, embodiments are given in detail with the accompanying drawings below to further explain the present invention. One person skilled in the art may understand the objects, features and effects of the present invention through the disclosure of the application. It should be noted that, the present invention may be implemented or applied through other embodiments, and various modifications and alterations may be made to the details of the application based on different perspectives and applications without departing from the spirit of the present invention. Further, the drawings in the applications are illustrative and are not drawn to actual sizes and ratios. The embodiments are given in detail below to describe associated technical contents of the present invention. It should be noted that, the disclosed contents are not to be construed as limitations to the present invention.

Figure 1:
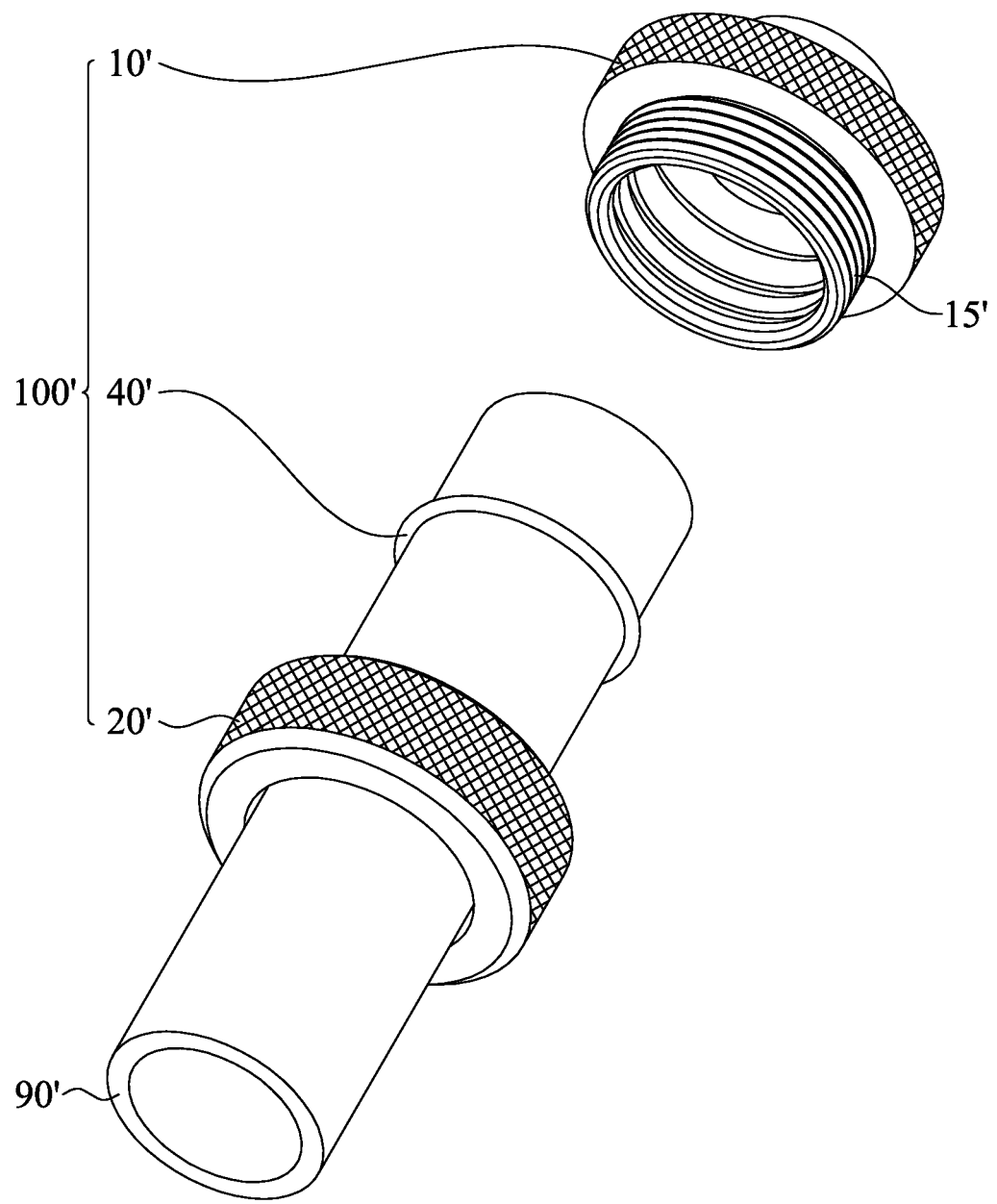
FIG. 1 is a schematic diagram of a pipe connector connecting to a water cooling pipe of the prior art.
Figure 2A:
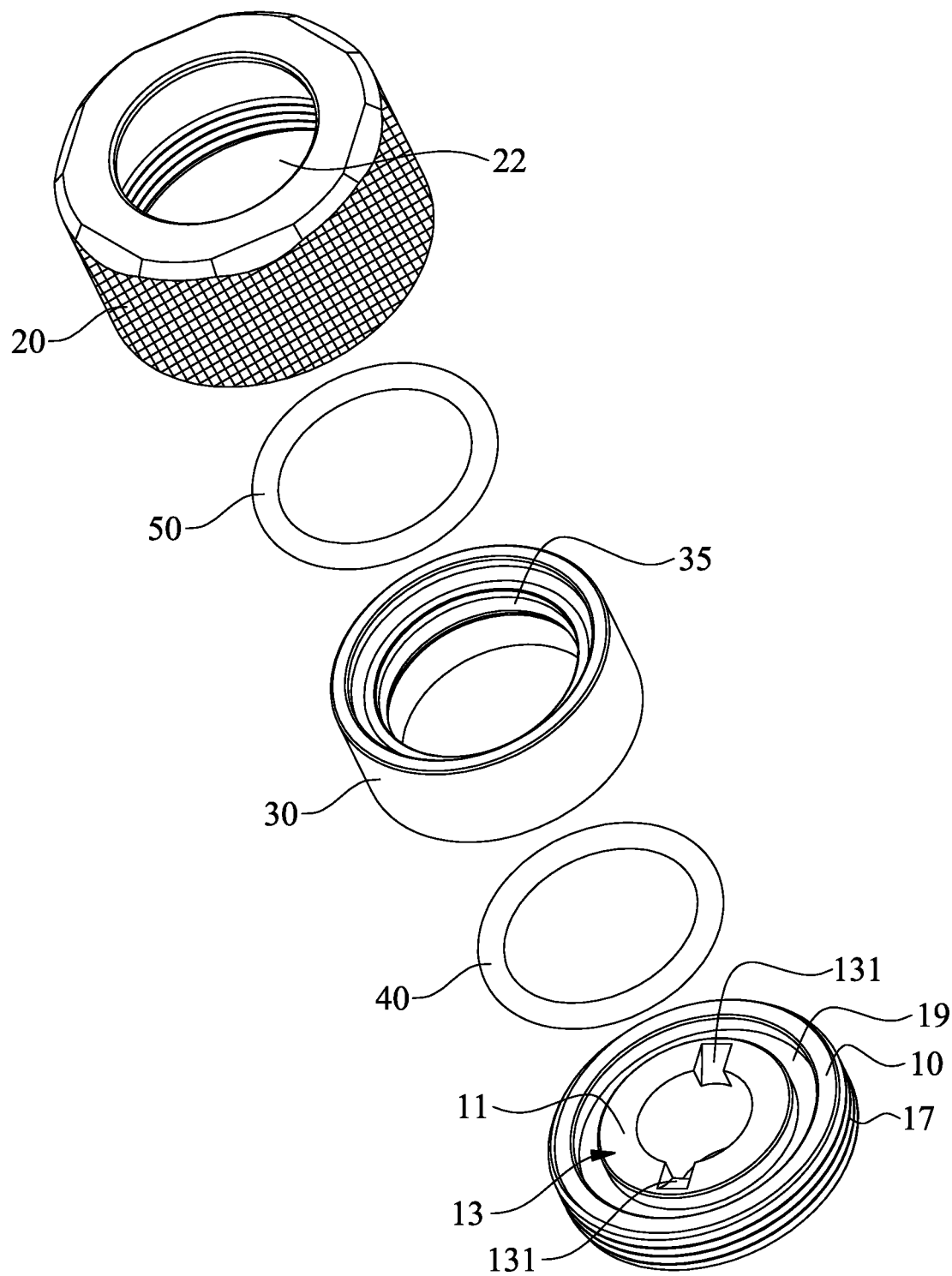
FIG. 2A is an exploded schematic diagram of a pipe connector structure from one angle according to an embodiment of the present invention.
Figure 2B:
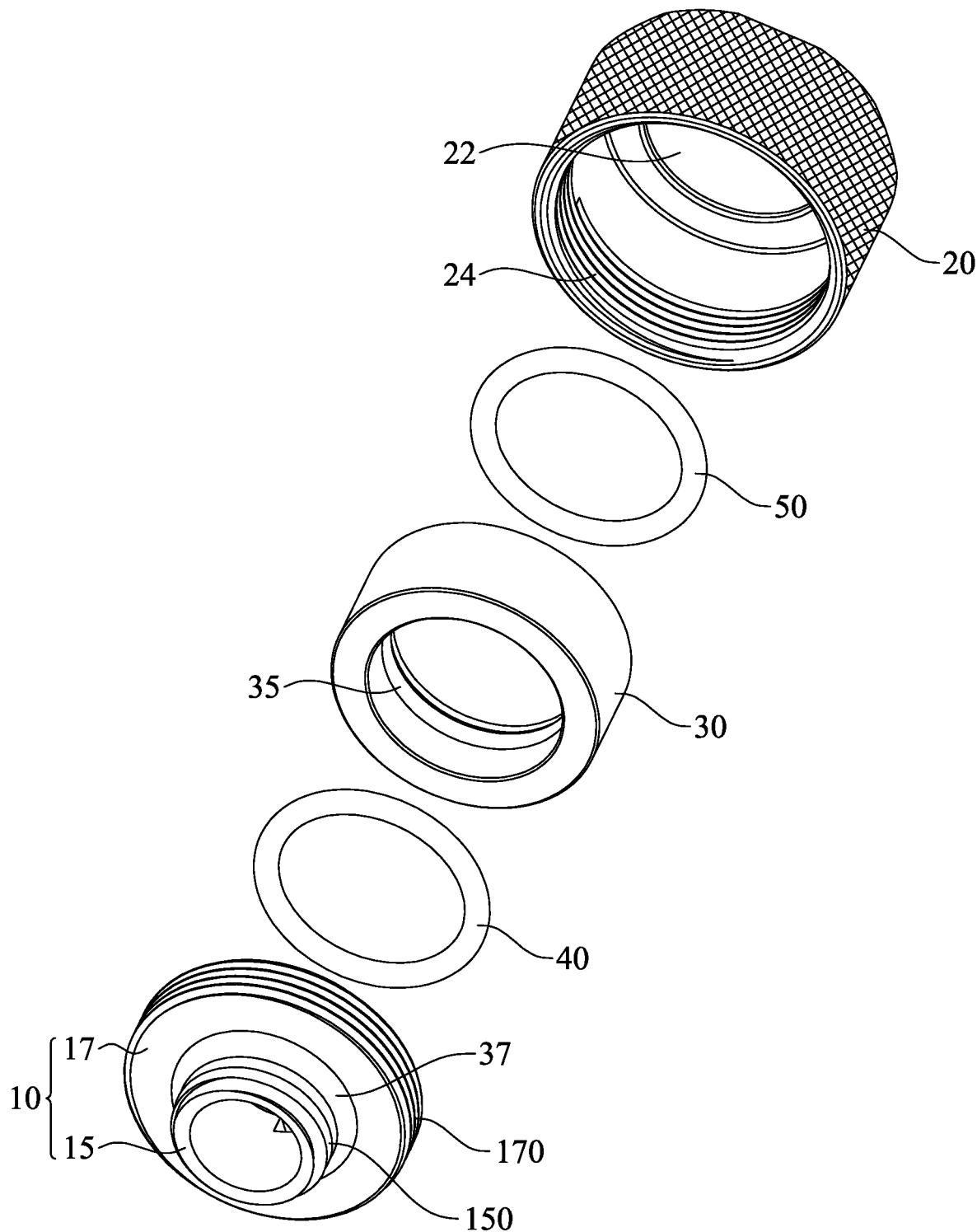
FIG. 2B is an exploded schematic diagram of a pipe connector structure from another angle according to an embodiment of the present invention.

FIG. 2A shows an exploded schematic diagram of a pipe connector structure 100 from an angle according to an embodiment of the present invention. FIG. 2B shows an exploded schematic diagram of a pipe connector structure 100 from another angle according to an embodiment of the present invention. As shown in FIG. 2A and FIG. 2B, the pipe connector structure 100 includes a base 10, a lid 20, a sleeve 30 and a first O-ring 40. The base 10 has a through hole 11 and a revealed upper surface 13. The lid 20 has a central through hole 22. The sleeve 30 is detachably accommodated in the lid 20. The first O-ring 40 is disposed at the revealed upper surface 13 and encircles the through hole 11.

In this embodiment, the base 10 includes a first thread portion 15 and a second thread portion 17. The first thread portion 15 is for connecting to an intercommunicating device (not shown), and the second thread portion 17 is located on the first thread portion 15, the second thread portion 17 does not protrude beyond the revealed upper surface 13. For example, the intercommunicating device is a water cooling fin, and the base 10 may be fastened on the water cooling fin through a thread 150 at an outer sidewall of the first thread portion 15 to be in communication with the water cooling fin.

A diameter of the second thread portion 17 is greater than a diameter of the first thread portion 15, but the present invention is not limited thereto. In some embodiments, the diameter of the second thread portion 17 may be smaller than the diameter of the first thread portion 15, depending on design requirements. Further, the lid 20 includes an inner thread structure 24, which corresponds to a thread 170 located at an outer sidewall of the second thread portion 17.

As shown in FIG. 2A and FIG. 2B, the sleeve 30 may be independent from the base 10 and the lid 20; that is, the sleeve 30 may be separate from the base 10 and the lid 20. In this embodiment, the pipe connector structure 100 may further include a second O-ring 50, which may be disposed between the sleeve 30 and the lid 20.

When a user wishes to connect a water cooling pipe to an intercommunicating device in an intercommunicating manner through the pipe connector structure 100 of the present invention, following steps are performed.

The base 10 is first fastened at the intercommunicating device through the first thread portion 15 of the base 10. In one embodiment, the pipe connector structure 100 further includes two notches 131, which are located symmetrically at a periphery of the through opening 11 and are recessed from the revealed upper surface 13 towards an inner part of the base 10. The notches 131 may accommodate fastening tools such as coins, so as to facilitate the user to fasten the base 10 onto the intercommunicating device through such fastening tools.

Meanwhile, the first O-ring 40 is disposed at the revealed upper surface 13 and encircles the through hole 11. As shown in FIG. 2A, in one embodiment, a ring channel 19 that encircles the through hole 11 may be formed on the revealed upper surface 13, and the first O-ring 40 may be disposed in the ring channel 19. It should be noted that, after the first O-ring 40 is disposed in the ring channel 19, the first O-ring 40 still protrudes from the revealed upper surface 13 to achieve a leakproof effect.

As the base 10 has the revealed upper surface 13, the revealed upper surface 13 at this point is a plane in contact with the connected water cooling pipe, and so the user may accurately cut a water cooling pipe having an appropriate length according to the revealed upper surface 13.

The sleeve 30, the second O-ring 50 and the lid 20 are accommodated around the water cooling pipe, and the water cooling pipe is placed on the revealed upper surface 13 of the base 10. The sleeve 30 accommodated in the lid 20 is for securing the water cooling pipe, and the second O-ring 50 located between the sleeve 30 and the lid 20 similarly provides a leakproof effect.

Next, by using an inner thread structure 24 of the lid 20 corresponding to the thread 170 at the outer sidewall of the second thread portion 17, the lid 20 is fastened at the second thread portion 17 to further connect and fix the water cooling pipe on the intercommunicating device in an intercommunicating manner. In this embodiment, the lid 20 may have a coarse outer sidewall to increase friction, so as to facilitate the user to fasten the inner thread structure 24 of the lid 20 to the second thread portion 17.

In continuation, when the pipe connector structure 100 according to the embodiment of the present invention is used to connect the water cooling pipe to an intercommunicating device in an intercommunicating manner, the user is capable of accurately cutting a water cooling pipe having an appropriate length according to the revealed upper surface 13 of the base 10. Further, because the water cooling pipe is not connected to the pipe connector structure 100 of the present invention by an inserting method, issues of being uncertain whether the water cooling pipe is completely inserted into the base and being likely inserted in an unaligned manner of the prior art are eliminated to effectively reduce the risks of liquid leakage. Further, the step of connecting the pipe connector structure 100 of the present invention and the water cooling pipe is much less susceptible to a restricted space and is suitable in a small space as opposed to the prior art; that is, the pipe connector structure 100 of the present invention is apt for a greater application scope.

As shown in FIG. 2B, in some embodiments, the pipe connector structure 100 may further include at least one inner O-ring 35, which is disposed at an inner sidewall of the sleeve 30. Alternatively, the pipe connector structure 100 may further include an outer O-ring 37. The outer O-ring 37 is disposed at an outer sidewall of the first thread portion 15 where the first thread portion 15 and the second thread portion 17 are connected, and reveals the thread 150 of the first thread portion 15. The at least one inner O-ring 35 and the outer O-ring 37 are used to further reinforce the leak-proof effect of the pipe connector structure 100.

Figure 3:
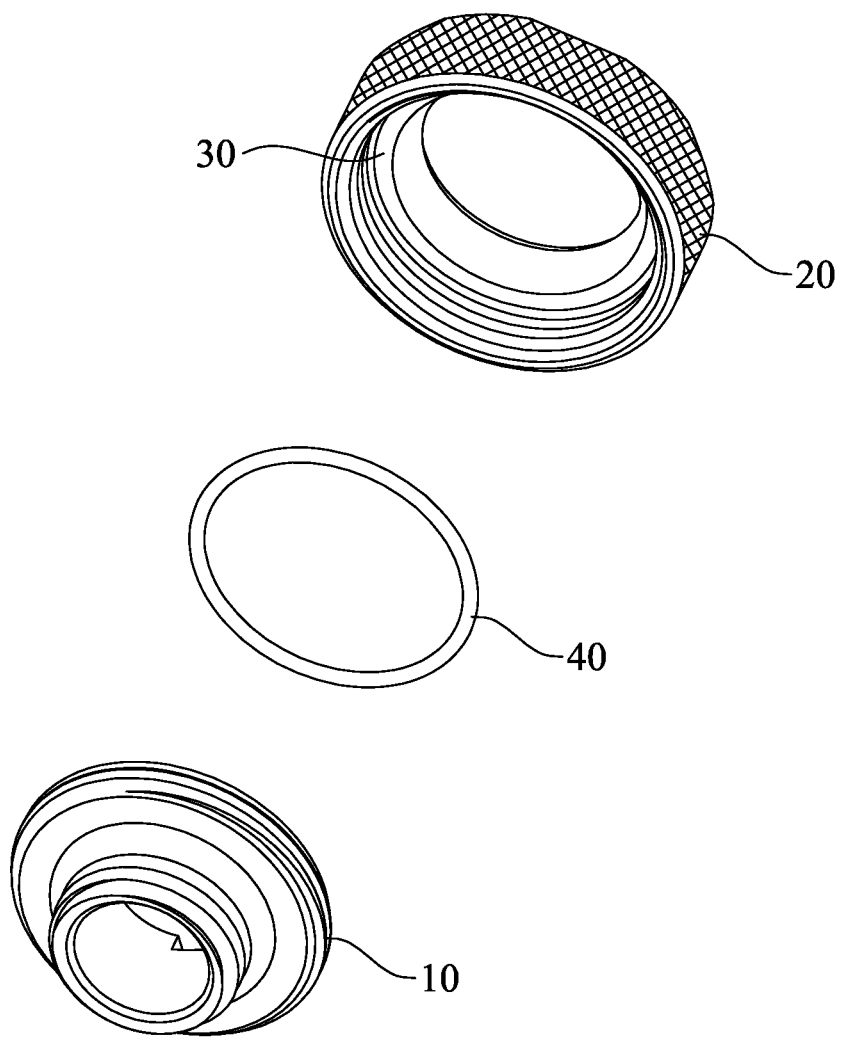
FIG. 3 is an exploded schematic diagram of a pipe connector structure according to another embodiment of the present invention.

In the foregoing embodiments, although the sleeve 30 being an independent unit from the lid 20 (i.e., the sleeve 30 is detachably accommodated in the lid 20) is given as an illustrative example, the present invention is not limited thereto. FIG. 3 shows an exploded schematic diagram of a pipe connector structure 101 according to another embodiment of the present invention. One difference of the pipe connector structure 101 in FIG. 3 from the pipe connector structure 100 in FIG. 2A and FIG. 2B is that, in the pipe connector structure 101, the sleeve 30 and the lid 20 are a formed integral, hence eliminating the second O-ring 50 disposed between the sleeve 30 and the lid 20. Details of other identical parts are omitted herein.

While the invention has been described in terms of what is presently considered to be the most practical and preferred embodiments, it is to be understood that the invention is only illustrative and needs not to be limited to the above embodiments. It should be noted that, equivalent variations and replacements made to the embodiments are to be encompassed within the scope of the present invention. Therefore, the scope of the present invention is to be accorded with the appended claims.

The claims are as follows:

1. A pipe connector structure, comprising:
   a base, having a through hole and a revealed upper surface, comprising:
      a first thread portion, for connecting to an intercommunicating device; and
      a second thread portion, located on the first thread portion;
   a lid, having a central through hole;
   a sleeve, located in the lid; and
   a first O-ring, disposed at the revealed upper surface and encircling the through hole;
   wherein the lid comprises an inner thread structure corresponding to a thread located at an outer sidewall of the second thread portion;
   wherein the revealed upper surface faces toward the lid, and the revealed upper surface is for allowing a pipe being placed on the revealed upper surface;
   wherein the second thread portion does not protrude beyond the revealed upper surface in an axial direction facing toward the lid.

2. The pipe connector structure according to claim 1, wherein the sleeve and the lid are a formed integral.

3. The pipe connector structure according to claim 1, further comprising:
   a second O-ring, disposed between the sleeve and the lid.

4. The pipe connector structure according to claim 1, further comprising:
   at least one inner O-ring, disposed at an inner sidewall of the sleeve.

5. The pipe connector structure according to claim 1, further comprising:
   an outer O-ring, disposed at an outer sidewall where the first thread portion and the second thread portion are connected, the outer O-ring revealing a thread of the first thread portion.

6. The pipe connector structure according to claim 1, further comprising:
   two notches, symmetrically located at a periphery of the through hole and recessed from the revealed upper surface towards an inner part of the base.

7. The pipe connector structure according to claim 1, wherein the lid has a coarse outer sidewall.

8. The pipe connector structure according to claim 1, wherein a diameter of the second thread portion is greater than a diameter of the first thread portion.

* * * * *